(12) United States Patent
Matsunaga et al.

(10) Patent No.: US 8,257,789 B2
(45) Date of Patent: Sep. 4, 2012

(54) FILM FORMATION METHOD IN VERTICAL BATCH CVD APPARATUS

(75) Inventors: Masanobu Matsunaga, Nirasaki (JP);
Nobutake Nodera, Nirasaki (JP);
Kazuhide Hasebe, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 361 days.

(21) Appl. No.: 12/564,484

(22) Filed: Sep. 22, 2009

(65) Prior Publication Data
US 2010/0136260 A1 Jun. 3, 2010

(30) Foreign Application Priority Data
Oct. 4, 2008 (JP) .................. 2008-259142

(51) Int. Cl.
*C23C 16/00* (2006.01)
*C23C 16/453* (2006.01)
(52) U.S. Cl. .............. 427/248.1; 427/569; 118/696; 118/729; 118/730
(58) Field of Classification Search ............ None
See application file for complete search history.

(56) References Cited

U.S. PATENT DOCUMENTS
5,874,368 A 2/1999 Laxman et al.
6,165,916 A 12/2000 Muraoka et al.
6,579,374 B2 * 6/2003 Bondestam et al. .......... 118/725
2001/0041250 A1 * 11/2001 Werkhoven et al. .......... 428/212
2002/0196591 A1 * 12/2002 Hujanen et al. .............. 360/326
2006/0150905 A1 * 7/2006 Sakai et al. .................. 118/715
2006/0286817 A1 12/2006 Kato et al.

FOREIGN PATENT DOCUMENTS
JP 2-93071 4/1990
JP 6-45256 2/1994
JP 2004-6801 1/2004

* cited by examiner

*Primary Examiner* — Timothy Meeks
*Assistant Examiner* — Joseph Miller, Jr.
(74) *Attorney, Agent, or Firm* — Oblon, Spivak, McClelland, Maier & Neustadt, L.L.P.

(57) ABSTRACT

A film formation method, in a vertical batch CVD apparatus, is preset to repeat a cycle a plurality of times to laminate thin films formed by respective times. The cycle alternately includes an adsorption step of adsorbing a source gas onto a surface of the target substrates and a reaction step of causing a reactive gas to react with the adsorbed source gas. The adsorption step is arranged to make a plurality of times a supply sub-step of performing supply of the source gas to the process field with an intermediate sub-step of stopping supply of the source gas to the process field interposed therebetween, while maintaining a shut-off state of supply of the reactive gas. The reaction step is arranged to continuously perform supply of the reactive gas to the process field, while maintaining a shut-off state of supply of the source gas.

14 Claims, 6 Drawing Sheets

FILM FORMATION METHOD IN VERTICAL BATCH CVD APPARATUS

BACKGROUND OF THE INVENTION

1. Field of the Invention

The present invention relates to a film formation method in a vertical batch CVD apparatus, and an apparatus and a computer readable medium each for performing the method. Particularly, the present invention relates to a semiconductor process technique for forming a reaction product film on a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor devices for constituting semiconductor integrated circuits, a target substrate, such as a semiconductor wafer, is subjected to various processes, such as film formation, etching, oxidation, diffusion, reformation, annealing, and natural oxide film removal. US 2006/0286817 A1 discloses a semiconductor processing method of this kind performed in a vertical heat-processing apparatus (of the so-called batch type). According to this method, semiconductor wafers are first transferred from a wafer cassette onto a vertical wafer boat and supported thereon at intervals in the vertical direction. The wafer cassette can store, e.g., 25 wafers, while the wafer boat can support 30 to 150 wafers. Then, the wafer boat is loaded into a process container from below, and the process container is airtightly closed. Then, a predetermined heat process is performed, while the process conditions, such as process gas flow rate, process pressure, and process temperature, are controlled.

In order to improve the performance of semiconductor integrated circuits, it is important to improve properties of insulating films used in semiconductor devices. Semiconductor devices include insulating films made of materials, such as $SiO_2$, PSG (Phospho Silicate Glass), P—SiO (formed by plasma CVD), P—SiN (formed by plasma CVD), and SOG (Spin On Glass), $Si_3N_4$ (silicon nitride). Particularly, silicon nitride films are widely used, because they have better insulation properties as compared to silicon oxide films, and they can sufficiently serve as etching stopper films or inter-level insulating films.

Several methods are known for forming a silicon nitride film on the surface of a semiconductor wafer by thermal CVD (Chemical Vapor Deposition). In such thermal CVD, a silicon-containing gas, such as monosilane ($SiH_4$), dichlorosilane (DCS: $SiH_2Cl_2$), hexachloro-disilane (HCD: $Si_2Cl_6$), bistertialbutylaminosilane (BTBAS: $SiH_2(NH(C_4H_9))_2$), or $(t-C_4H_9NH)_2SiH_2$, is used as a silicon source gas. For example, a silicon nitride film is formed by thermal CVD using a gas combination of BTBAS+$NH_3$ (see U.S. Pat. No. 5,874,368 A) or $Si_2Cl_6$+$NH_3$.

In recent years, owing to the demands of increased miniaturization and integration of semiconductor integrated circuits, it is required to alleviate the thermal history of semiconductor devices in manufacturing steps, thereby improving the characteristics of the devices. For vertical processing apparatuses, it is also required to improve semiconductor processing methods in accordance with the demands described above. For example, there is a CVD (Chemical Vapor Deposition) method for a film formation process, which performs film formation while intermittently supplying a source gas and so forth to repeatedly form layers each having an atomic or molecular level thickness, one by one, or several by several (for example, Jpn. Pat. Appln. KOKAI Publications No. 2-93071 and No. 6-45256 and U.S. Pat. No. 6,165,916 A). In general, this film formation process is called ALD (Atomic layer Deposition) or MLD (Molecular Layer Deposition), which allows a predetermined process to be performed without exposing wafers to a very high temperature.

For example, where dichlorosilane (DCS) and $NH_3$ are supplied as a silicon-containing gas and a nitriding gas, respectively, to form a silicon nitride film (SiN), the process is performed, as follows. Specifically, DCS and $NH_3$ gas are alternately and intermittently supplied into a process container with purge periods interposed therebetween. When $NH_3$ gas is supplied, an RF (radio frequency) is applied to generate plasma within the process container so as to promote a nitridation reaction. More specifically, when DCS is supplied into the process container, a layer with a thickness of one molecule or more of DCS is adsorbed onto the surface of wafers. The superfluous DCS is removed during the purge period. Then, $NH_3$ is supplied and plasma is generated, thereby performing low temperature nitridation to form a silicon nitride film. These sequential steps are repeated to complete a film having a predetermined thickness.

In recent years, there is known an apparatus including a buffer tank having a certain capacity and disposed on a source gas supply line in order to improve the film formation rate and the silicon concentration in the film (Jpn. Pat. Appln. KOKAI Publications No. 2004-006801). A large amount of source gas is temporarily charged in the buffer tank, and then the source gas is discharged from the buffer tank so that the source gas is intermittently supplied into a process container.

BRIEF SUMMARY OF THE INVENTION

An object of the present invention is to provide a film formation method in a vertical batch CVD apparatus, which can improve the film formation rate and film quality, and an apparatus and a computer readable medium each for performing the method.

According to a first aspect of the present invention, there is provided a film formation method, in a vertical batch CVD apparatus, for forming a reaction product film on a plurality of target substrates by a reaction between a source gas and a reactive gas within a process field inside a process container configured to accommodate the target substrates at intervals in a vertical direction and to be selectively supplied with the source gas and the reactive gas, the method being preset to repeat a cycle a plurality of times to laminate thin films formed by respective times, the cycle alternately comprising: an adsorption step of performing supply of the source gas to the process field, thereby adsorbing the source gas onto a surface of the target substrates; and a reaction step of performing supply of the reactive gas to the process field, thereby causing the reactive gas to react with the source gas adsorbed on the surface of the target substrates, wherein the adsorption step is arranged to make a plurality of times a supply sub-step of performing supply of the source gas to the process field with an intermediate sub-step of stopping supply of the source gas to the process field interposed therebetween, while maintaining a shut-off state of supply of the reactive gas to the process field, and wherein the reaction step is arranged to continuously perform supply of the reactive gas to the process field, while maintaining a shut-off state of supply of the source gas to the process field.

According to a second aspect of the present invention, there is provided a vertical batch CVD apparatus comprising: a process container having a process field configured to accommodate a plurality of target substrates at intervals in a vertical direction; a support member configured to support the target substrates inside the process field; a heater configured to heat the target substrates inside the process field; an exhaust system configured to exhaust the process field; a source gas supply circuit configured to supply a source gas to the process field; a reactive gas supply circuit configured to supply a reactive gas to the process field; a control section configured to control an operation of the apparatus, wherein the control section is preset to execute a film formation method for forming a reaction product film on the target substrates by a reaction between the source gas and the reactive gas within the process field, the method being preset to repeat a cycle a plurality of times to laminate thin films formed by respective times, the cycle alternately comprising an adsorption step of performing supply of the source gas to the process field, thereby adsorbing the source gas onto a surface of the target substrates, and a reaction step of performing supply of the reactive gas to the process field, thereby causing the reactive gas to react with the source gas adsorbed on the surface of the target substrates, wherein the adsorption step is arranged to make a plurality of times a supply sub-step of performing supply of the source gas to the process field with an intermediate sub-step of stopping supply of the source gas to the process field interposed therebetween, while maintaining a shut-off state of supply of the reactive gas to the process field, and wherein the reaction step is arranged to continuously perform supply of the reactive gas to the process field, while maintaining a shut-off state of supply of the source gas to the process field.

According to a third aspect of the present invention, there is provided a computer readable medium containing program instructions for execution on a processor in a vertical batch CVD apparatus including a process field inside a process container configured to accommodate a plurality of target substrates at intervals in a vertical direction and to be selectively supplied with a source gas and a reactive gas, wherein the program instructions, when executed by the processor, cause the apparatus to conduct the film formation method according to the first aspect.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
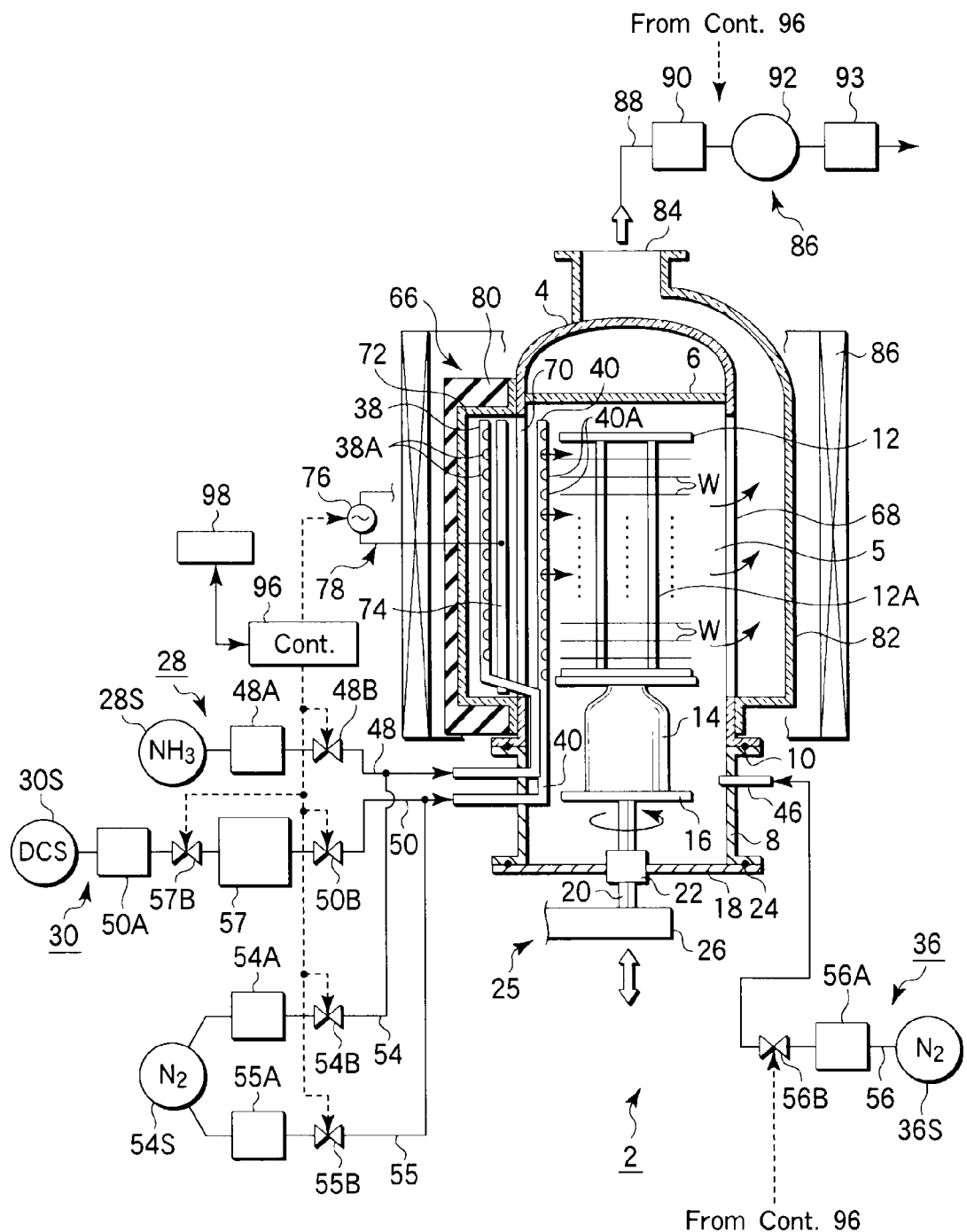
FIG. 1 is a sectional view showing a film formation apparatus (vertical batch CVD apparatus) according to an embodiment of the present invention.

In the process of developing the present invention, the inventors studied problems of conventional techniques for semiconductor processes, in relation to methods for forming a silicon nitride film or the like. As a result, the inventors have arrived at the findings given below.

Specifically, where a thin film of this kind is formed, it may be required to increase the film formation rate or to control, e.g., to increase, the silicon concentration in the film. In this case, as described above, a buffer tank can be provided on the gas passage of a silicon-containing gas used as a source gas. By repeating charge and discharge of the source gas into and from the buffer tank, a large amount of gas is intermittently supplied into the process container.

However, in film formation apparatuses practically employed, the capacity (volume) of the buffer tank usable in the apparatuses is restricted in relation to the entire size of each apparatus, and so the buffer tank is not allowed to have an unlimitedly large capacity. As a countermeasure, the pressure inside the buffer tank may be set higher when the source gas is temporarily stored therein. However, because of a safety precaution, it is necessary to prevent the pressure of the source gas inside the buffer tank from exceeding a prescribed value. Further, if a large amount of gas with a high pressure is supplied at one time, a large amount of exhaust gas with unreacted part of the source gas is exhausted at one time. In this case, a detoxification unit disposed in the exhaust system to remove harmful components in the exhaust gas cannot treat the exhaust gas within its process capacity, resulting in letting harmful gas components leak out of the apparatus.

Accordingly, it is preferable to supply a large amount of source gas into the process container without imperiling the security in intermittently supplying the source gas. Further, it is preferable not only to increase the film formation rate but also to control, e.g., to increase, the concentration of an element derived from the source gas in the film.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 2:
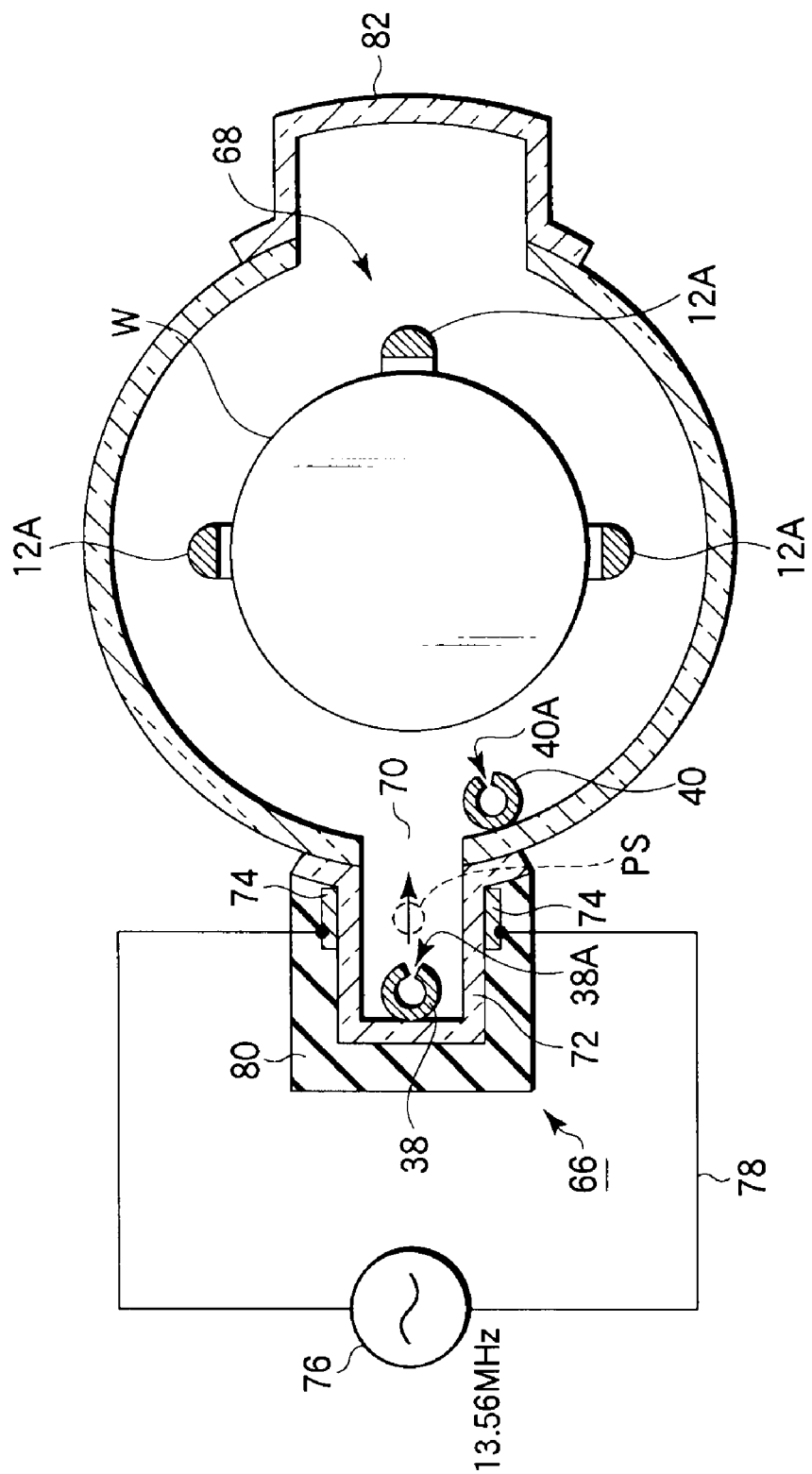
FIG. 2 is a sectional plan view showing part of the apparatus shown in FIG. 1.

FIG. 1 is a sectional view showing a film formation apparatus (vertical batch CVD apparatus) according to an embodiment of the present invention. FIG. 2 is a sectional plan view showing part of the apparatus shown in FIG. 1. The film formation apparatus 2 has a process field configured to be selectively supplied with a first process gas containing dichlorosilane (DCS) gas as a silicon-containing gas, and a second process gas containing ammonia (NH$_3$) gas as a nitriding gas. The film formation apparatus 2 is configured to form a silicon nitride film on target substrates in the process field.

The apparatus 2 includes a process container 4 shaped as a cylindrical column with a ceiling and an opened bottom, in which a process field 5 is defined to accommodate and process a plurality of semiconductor wafers (target substrates) stacked at intervals in the vertical direction. The entirety of the process container 4 is made of, e.g., quartz. The top of the process container 4 is provided with a quartz ceiling plate 6 to airtightly seal the top. The bottom of the process container 4 is connected through a seal member 10, such as an O-ring, to a cylindrical manifold 8. The process container may be entirely formed of a cylindrical quartz column without a manifold 8 separately formed.

The manifold 8 is made of, e.g., stainless steel, and supports the bottom of the process container 4. A wafer boat 12 made of quartz is moved up and down through the bottom port of the manifold 8, so that the wafer boat 12 is loaded/unloaded into and from the process container 4. A number of target substrates or semiconductor wafers W are stacked on a wafer boat 12. For example, in this embodiment, the wafer boat 12 has struts 12A that can support, e.g., about 50 to 100 wafers having a diameter of 300 mm at essentially regular intervals in the vertical direction.

The wafer boat 12 is placed on a table 16 through a heat-insulating cylinder 14 made of quartz. The table 16 is supported by a rotary shaft 20, which penetrates a lid 18 made of, e.g., stainless steel, and used for opening/closing the bottom port of the manifold 8. The portion of the lid 18 where the rotary shaft 20 penetrates is provided with, e.g., a magnetic-fluid seal 22, so that the rotary shaft 20 is rotatably supported in an airtightly sealed state. A seal member 24, such as an O-ring, is interposed between the periphery of the lid 18 and the bottom of the manifold 8, so that the interior of the process container 4 can be kept sealed.

The rotary shaft 20 is attached at the distal end of an arm 26 supported by an elevating mechanism 25, such as a boat elevator. The elevating mechanism 25 moves the wafer boat 12 and lid 18 up and down together. Further, when the rotary shaft 20 is driven by a rotating mechanism in the arm 26, the wafer boat 12 is rotated, and so the wafers on the wafer boat 12 are also rotated about a vertical axis extending through their center. However, the table 16 may be fixed to the lid 18, so that wafers W are processed without rotation of the wafer boat 12.

A gas supply section is connected to the side of the manifold 8 to supply predetermined process gases to the process field 5 within the process container 4. Specifically, the gas supply section includes a second process gas supply circuit 28, a first process gas supply circuit 30, and a purge gas supply circuit 36. The first process gas supply circuit 30 is arranged to supply a first process gas containing a silicon-containing gas, such as DCS (dichlorosilane) gas. The second process gas supply circuit 28 is arranged to supply a second process gas containing a nitriding gas, such as ammonia (NH$_3$) gas. The purge gas supply circuit 36 is arranged to supply an inactive gas, such as N$_2$ gas, as a purge gas. Each of the first and second process gases is mixed with a suitable amount of carrier gas, as needed. However, such a carrier gas will be mentioned only when necessary, hereinafter, for the sake of simplicity of explanation.

More specifically, the second and first process gas supply circuits 28 and 30 include gas distribution nozzles 38 and 40, respectively, each of which is formed of a quartz pipe which penetrates the sidewall of the manifold 8 from the outside and then turns and extends upward (see FIG. 1). The gas distribution nozzles 38 and 40 respectively have a plurality of gas spouting holes 38A and 40A, each set of holes being formed at predetermined intervals in the longitudinal direction (the vertical direction) over all the wafers W on the wafer boat 12. Each set of the gas spouting holes 38A and 40A deliver the corresponding process gas almost uniformly in the horizontal direction, so as to form gas flows parallel with the wafers W on the wafer boat 12, as needed. Since the nozzles 38 and 40 have such a function, they are called a distribution nozzle. On the other hand, the purge gas supply circuit 36 includes a short gas nozzle 46, which penetrates the sidewall of the manifold 8 from outside.

The nozzles 38, 40, and 46 are connected to gas sources 28S, 30S, and 36S of NH$_3$ gas, DCS gas, and N$_2$ gas, respectively, through gas supply lines (gas passages) 48, 50, and 56, respectively. Further, the nozzles 38 and 40 are respectively connected through gas supply lines 54 and 55 to a gas source 54S of an inactive gas, such as N$_2$ gas, which is used as an assist gas (serving as a carrier gas or purge gas). The gas supply lines 48, 50, 54, 55, and 56 are provided with flow rate controllers 48A, 50A, 54A, 55A, and 56A, such as mass flow controllers, and switching valves 48B, 50B, 54B, 55B, and 56B, respectively. With this arrangement, NH$_3$ gas, DCS gas, and N$_2$ gas can be supplied at controlled flow rates. The gas supply lines 54 and 55 of the assist gas are respectively connected to the gas supply lines 48 and 50 of NH$_3$ gas and DCS gas at positions downstream from the switching valves 48B and 50B.

The gas supply line 50 of DCS gas is provided with a buffer tank 57 between the flow rate controller 50A and switching valve 50B, and is configured to temporarily store DCS gas (source gas) charged therein. The switching valve 50B and a switching valve 57B are respectively disposed at positions downstream and upstream from the buffer tank 57. Accordingly, when the upstream switching valve 57B is opened, DCS gas is charged into the buffer tank 57. Further, when the downstream switching valve 50B is opened, DCS gas charged in the buffer tank 57 is discharged downstream. Although it depends on the entire size of the apparatus, the capacity (volume) of the buffer tank 57 is set to be, e.g., about 1 to 2 liters.

A gas exciting section 66 is formed on the sidewall of the process container 4 in the vertical direction. On the side of the process container 4 opposite to the gas exciting section 66, a long narrow exhaust port 68 for vacuum-exhausting the inner atmosphere is formed by cutting the sidewall of the process container 4 in, e.g., the vertical direction.

Specifically, the gas exciting section 66 has a vertically long narrow opening 70 formed by cutting a predetermined width of the sidewall of the process container 4, in the vertical direction. The opening 70 is covered with a quartz cover (plasma generation box) 72 airtightly connected to the outer surface of the process container 4 by welding. The cover 72 has a vertically long narrow shape with a concave cross-section, so that it projects outward from the process container 4.

With this arrangement, the gas exciting section 66 is formed such that it projects outward from the sidewall of the process container 4 and is opened on the other side to the interior of the process container 4. In other words, the inner space of the gas exciting section 66 communicates with the process field 5 within the process container 4. The opening 70 has a vertical length sufficient to cover all the wafers W on the wafer boat 12 in the vertical direction. The opening 70 may be covered with a slit plate having a number of slits.

A pair of long narrow electrodes 74 are disposed on the opposite outer surfaces of the cover 72, and face each other while extending in the longitudinal direction (the vertical direction). The electrodes 74 are connected to an RF (Radio Frequency) power supply 76 for plasma generation, through feed lines 78. An RF voltage of, e.g., 13.56 MHz is applied to the electrodes 74 to form an RF electric field for exciting plasma between the electrodes 74. The frequency of the RF voltage is not limited to 13.56 MHz, and it may be set at another frequency, e.g., 400 kHz.

The gas distribution nozzle 38 of the second process gas is bent outward in the radial direction of the process container 4, at a position lower than the lowermost wafer W on the wafer boat 12. Then, the gas distribution nozzle 38 vertically extends at the deepest position (the farthest position from the center of the process container 4) in the gas exciting section 66. As shown also in FIG. 2, the gas distribution nozzle 38 is separated outward from an area sandwiched between the pair of electrodes 74 (a position where the RF electric field is most intense), i.e., a plasma generation area PS where the main plasma is actually generated. The second process gas containing $NH_3$ gas is spouted from the gas spouting holes 38A of the gas distribution nozzle 38 toward the plasma generation area PS. Then, the second process gas is selectively excited (decomposed or activated) in the plasma generation area PS, and is supplied in this state onto the wafers W on the wafer boat 12.

An insulating protection cover 80 made of, e.g., quartz is attached on and covers the outer surface of the cover 72. A cooling mechanism (not shown) is disposed in the insulating protection cover 80 and comprises coolant passages respectively facing the electrodes 74. The coolant passages are supplied with a coolant, such as cooled nitrogen gas, to cool the electrodes 74. The insulating protection cover 80 is covered with a shield (not shown) disposed on the outer surface to prevent RF leakage.

At a position near and outside the opening 70 of the gas exciting section 66, the gas distribution nozzle 40 of the first process gas is disposed. Specifically, the gas distribution nozzle 40 extends upward on one side of the outside of the opening 70 (in the process container 4). The first process gas containing DCS gas is spouted from the gas spouting holes 40A of the gas distribution nozzle 40 toward the center of the process container 4.

On the other hand, the exhaust port 68, which is formed opposite the gas exciting section 66, is covered with an exhaust port cover member 82. The exhaust port cover member 82 is made of quartz with a U-shape cross-section, and attached by welding. The exhaust cover member 82 extends upward along the sidewall of the process container 4, and has a gas outlet 84 at the top of the process container 4. The gas outlet 84 is connected to a vacuum-exhaust system 86 including a vacuum pump and so forth. The vacuum exhaust system 86 has an exhaust passage 88 connected to the gas outlet 84, on which a pressure regulation valve 90 for adjusting the pressure inside the process container 4, a vacuum pump 92, and a detoxification unit 93 for removing undesirable substances are disposed in this order from the upstream side. When the vacuum exhaust system 86 is operated, the process container 4 is vacuum-exhausted to maintain a predetermined pressure. The detoxification unit 93 may be of the dry type, combustion type, or wet type, in accordance with gas components to be removed from the exhaust gas.

The process container 4 is surrounded by a heater 94, which is used for heating the atmosphere within the process container 4 and the wafers W. A thermocouple (not shown) is disposed near the exhaust port 68 in the process container 4 to control the heater 94.

The film formation apparatus 2 further includes a main control section 96 formed of, e.g., a computer, to control the entire apparatus. The main control section 96 can control a film formation process as described below in accordance with process recipes stored in the storage section 98 thereof in advance, with reference to the film thickness and composition of a film to be formed. In the storage section 98, the relationship between the process gas flow rates and the thickness and composition of the film is also stored as control data in advance. Accordingly, the main control section 96 can control the elevating mechanism 25, gas supply circuits 28, 30, and 36 (including supply of DCS gas into the buffer tank 57 and supply of $N_2$ gas from the gas source 54S), exhaust system 86, gas exciting section 66, heater 94, and so forth, based on the stored process recipes and control data. Examples of a storage medium are a magnetic disk (flexible disk, hard disk (a representative of which is a hard disk included in the storage section 98), etc.), an optical disk (CD, DVD, etc.), a magneto-optical disk (MO, etc.), and a semiconductor memory.

Next, an explanation will be given of a film formation method (so called ALD or MLD film formation) performed in the apparatus shown in FIG. 1. In this film formation method, a silicon nitride film is formed on semiconductor wafers by ALD or MLD. In order to achieve this, a first process gas containing dichlorosilane (DCS) gas as a silicon-containing gas and a second process gas containing ammonia ($NH_3$) gas as a nitriding gas are selectively supplied into the process field 5 accommodating wafers W. This selective supply is used to alternately repeat a plurality of times an adsorption step of adsorbing DCS gas on the surface of the wafers W and a reaction step of causing ammonia gas to react with DCS gas adsorbed on the surface of the wafers W to form a thin film of silicon nitride. Specifically, a film formation process is performed along with the following operations.

<Film Formation Process>

At first, the wafer boat 12 at room temperature, which supports a number of, e.g., 50 to 100, wafers having a diameter of 300 mm, is loaded into the process container 4 heated at a predetermined temperature, and the process container 4 is airtightly closed. Then, the interior of the process container 4 is vacuum-exhausted and kept at a predetermined process pressure, and the wafer temperature is increased to a process temperature for film formation. At this time, the apparatus is in a waiting state until the temperature becomes stable. Then, while the wafer boat 12 is rotated, the DCS gas and ammonia gas are intermittently supplied from the respective gas distribution nozzles 40 and 38 at controlled flow rates. On the other hand, the assist gas ($N_2$ gas) is continuously supplied from the gas distribution nozzles 40 and 38.

The first process gas containing DCS gas is supplied from the gas spouting holes 40A of the gas distribution nozzle 40 to form gas flows parallel with the wafers W on the wafer boat 12. While being supplied, the DCS gas is activated by the heating temperature to the process field 5, and molecules of the DCS gas and molecules and atoms of decomposition products generated by their decomposition are adsorbed on the wafers W.

On the other hand, the second process gas containing $NH_3$ gas is supplied from the gas spouting holes 38A of the gas distribution nozzle 38 to form gas flows parallel with the wafers W on the wafer boat 12. When the second process gas is supplied, the gas exciting section 66 is set in the ON-state, as described later.

When the gas exciting section 66 is set in the ON-state, the second process gas is excited and partly turned into plasma when it passes through the plasma generation area PS between the pair of electrodes 74. At this time, for example, radicals (activated species), such as $N^*$, $NH^*$, $NH_2^*$, and $NH_3^*$, are produced (the symbol [*] denotes that it is a radical). The radicals flow out from the opening 70 of the gas exciting section 66 toward the center of the process container 4, and are supplied into gaps between the wafers W in a laminar flow state.

The radicals react with molecules and so forth of DCS gas adsorbed on the surface of the wafers W, so that a thin film is formed on the wafers W. Alternatively, when the DCS gas flows onto radicals derived from the $NH_3$ gas or molecules and atoms of decomposition products derived from the $NH_3$ gas and adsorbed on the surface of the wafers W, the same reaction is caused, so a silicon nitride film is formed on the wafers W.

Figure 3:
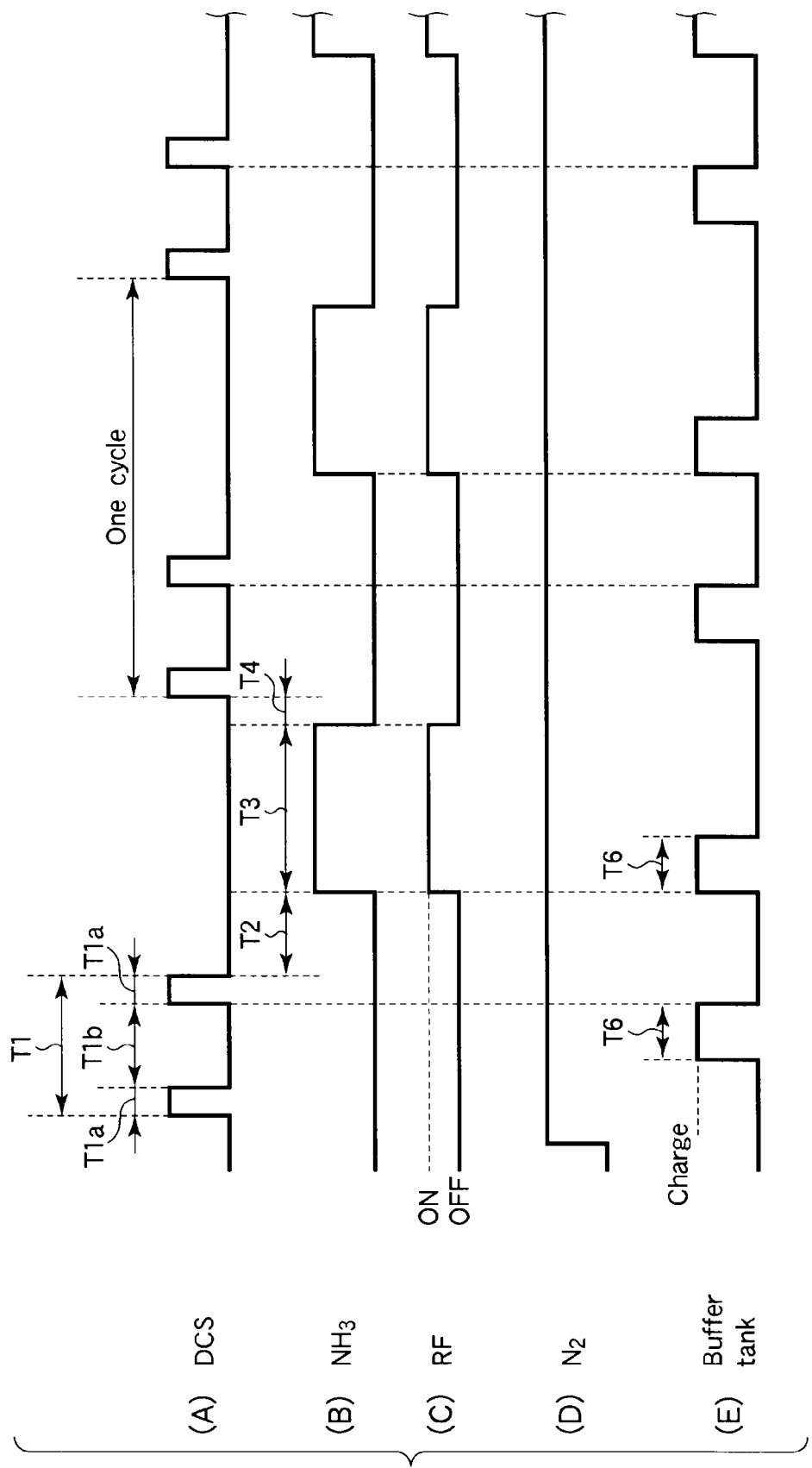
FIG. 3 is a timing chart showing the gas supply, RF (radio frequency) application, and buffer tank charge of a film formation method according to an embodiment of the present invention.

FIG. 3 is a timing chart showing the gas supply, RF (radio frequency) application, and buffer tank charge of a film formation method according to an embodiment of the present invention. As shown in FIG. 3, the film formation method according to this embodiment is arranged such that a cycle comprising first to fourth steps T1 to T4 is repeated a number of times, and thin films of silicon nitride formed by respective times are laminated, thereby arriving at a silicon nitride film having a target thickness.

Specifically, the first step T1 is arranged to perform supply of the DCS gas to the process field 5, while maintaining the shut-off state of supply of the ammonia gas (denoted as $NH_3$ in FIG. 3) to the process field 5. In other words, the first step T1 serves as an adsorption step of adsorbing DCS molecules and so forth on the surface of the wafers W by supplying the DCS gas to process field 5. The adsorption step is arranged to make a plurality of times (twice in FIG. 3) a supply sub-step T1a of performing supply of the DCS gas to the process field 5, with an intermediate sub-step T1b of stopping supply the DCS gas to the process field 5 interposed therebetween, while maintaining the shut-off state of supply of the ammonia gas.

The third step T3 is arranged to perform supply of the ammonia gas to the process field 5, while maintaining the shut-off state of supply of the DCS gas to the process field 5. Further, in the third step T3, the RF power supply 76 is set in the ON state to turn the ammonia gas into plasma by the gas exciting section 66, so as to supply the ammonia gas in an activated state to the process field 5. In other words, the third step T3 serves as a reaction step of causing radicals derived from the ammonia gas to react with DCS molecules and so forth adsorbed on the surface of the wafers W by supplying the ammonia gas to the process field 5. The reaction step is arranged to continuously perform supply of the ammonia gas and turn it into plasma, while maintaining the shut-off state of supply of the DCS gas.

Each of the second and fourth steps T2 and T4 is arranged to maintain the shut-off state of supply of the DCS gas and ammonia gas to the process field 5. Each of the second and fourth steps T2 and T4 serves as a purge step of removing the residual gas within the process container 4. The term "purge" means removal of the residual gas within the process container 4 by vacuum-exhausting the interior of the process container 4 while supplying an inactive gas, such as $N_2$ gas, into the process container 4, or by vacuum-exhausting the interior of the process container 4 while maintaining the shut-off state of supply of all the gases. In this respect, the second and fourth steps T2 and T4 may be arranged such that the first half utilizes only vacuum-exhaust and the second half utilizes both vacuum-exhaust and inactive gas supply.

In this embodiment, the exhaust system 86 is set to continuously operate the vacuum pump 92 during the film formation process. The process container 4 is kept vacuum-exhausted over all the first to fourth steps T1 to T4. Further, the assist gas of $N_2$ gas is kept supplied over all the first to fourth steps T1 to T4 to promote the gas flow. Consequently, the assist gas serves as a carrier gas for the source gas and reactive gas in the supply sub-step T1a and third step T3, respectively, and further serves to carry reaction byproducts generated by the reaction and unreacted gas components in the intermediate sub-step T1b, second step T2, and fourth step T4 so that they are exhausted from inside the process container 4 through the exhaust system 86. However, the assist gas may be stopped in the intermediate sub-step T1b, second step T2, and fourth step T4, so that residual substances are carried in the flow of exhaust gas and exhausted from inside the process container 4 through the exhaust system 86. The harmful components contained in the exhaust gas are removed by the detoxification unit 93.

As shown in FIG. 3, the first step (adsorption step) T1 is arranged to supply the source gas or DCS gas pulsewise a plurality of times, such as twice as in this embodiment. Each pulse of this supply is formed by discharging, into the process container 4, all the DCS gas charged or replenished in the buffer tank 57 (see FIG. 1).

The charge (replenishment) of DCS gas into the buffer tank 57 is started and ended by opening and closing the switching valve 57B disposed on the upstream side of the buffer tank 57. In this embodiment, the charge of DCS gas into the buffer tank 57 (charge period T6) is performed within the intermediate sub-step T1b of the first step (adsorption step) T1 and within the third step (reaction step) T3. When the DCS gas is supplied into the process container 4, the switching valve 50B disposed on the downstream side of the buffer tank 57 is opened, so that a large amount of DCS gas is discharged from the buffer tank 57 into the process container 4 at a blast by use of the pressure difference.

Before the start of the process, a predetermined amount of DCS gas is charged into the buffer tank 57, so that a large amount of DCS gas can be supplied into the process container 4 at the first supply sub-step T1a of the first adsorption step T1. Further, when the DCS gas is charged into the buffer tank 57, the charge time is set to prevent the pressure inside the buffer tank 57 from exceeding a prescribed value, because of a safety precaution.

As described above, every adsorption step T1 is arranged to adsorb the DCS gas on the surface of the wafers W by discharging the DCS gas from the buffer tank 57 a plurality of times, such as twice as in this embodiment. Consequently, a large amount of DCS gas is adsorbed on the surface of the wafers W to improve the film formation rate while assuring the safety. Further, the Si concentration in the silicon nitride film formed on the wafers W is more accurately controlled, e.g., increased. Further, since the DCS gas is supplied in time division, harmful components in the exhaust gas can be reliably removed even where the detoxification unit 93 has a smaller processing power. In this respect, if an excessive amount of DCS gas were to be supplied at a blast by use of a higher charge pressure inside the buffer tank, a problem would arise in relation to the processing power of the detoxification unit 93.

In FIG. 3, the supply sub-step T1a is set at about 3 seconds, the intermediate sub-step T1b is set at about 11 seconds, the second step T2 is set at about 11 seconds, the third step T3 is set at about 20 seconds, and the fourth step T4 is set at about 3 seconds. Each charge period T6 to the buffer tank 57 is set at about 8 seconds with a flow rate of DCS gas set at 2 slm. The NH₃ gas supplied in the third step T3 is set at a flow rate of 5 slm. The assist gas of N₂ gas is set at a flow rate of 0.2 slm. The film thickness obtained by one cycle of the first to fourth steps T1 to T4 is about 0.10 to 0.13 nm. Accordingly, for example, where the target film thickness is 50 nm, the cycle is repeated about 450 to 500 times. However, these values of time and thickness are merely examples and thus are not limiting.

The process temperature is set to be within a range of 450 to 700° C., such as about 630° C. The process pressure is changed within a range of 0.133 to 1,330 Pa, such that the adsorption step T1 uses a higher pressure within the pressure range.

According to this embodiment, the charge of DCS gas into the buffer tank 57 is performed within the intermediate sub-step T1b of the first step (adsorption step) T1 and within the third step (reaction step) T3. However, particularly, the second charge in one cycle can be performed anytime between the adsorption step of this cycle and the adsorption step of the next cycle. Further, where the pressure inside the buffer tank 57 does not exceed the upper limit, the switching valve 57B on the upstream side may be omitted or this valve may be always set open to continuously charge the DCS gas into the buffer tank 57. In this case, the DCS gas is kept charged into the buffer tank 57, while the buffer tank 57 is intermittently opened relative to the process container 4, According to this embodiment, the adsorption step T1 of one cycle is arranged to supply the DCS gas (source gas) pulsewise twice into process container 4. Alternatively, one adsorption step T1 may be arranged to supply the DCS gas pulsewise three times or more. In this case, the DCS gas is charged into the buffer tank 57 prior to each pulse of this DCS gas supply.

Further, during the film formation process, the wafer boat 12 is rotated several times per minute, and thus the wafers are also rotated about a vertical axis extending through their center. In this respect, the rotation of the wafer boat 12 should be set not to be synchronous with the spray timing of the DCS gas from the gas spouting holes 40A of the gas distribution nozzle 40. This is so because, if they are synchronous with each other, the DCS gas is sprayed toward the same portion of the wafers in the annular direction. In this case, the film thickness on this portion becomes larger than that on the other portions, and so the planar uniformity of the film thickness may be deteriorated.

In light of this, according to this embodiment, the rotation of the wafer boat 12 and the spray timing of the DCS gas from the gas spouting holes 40A are correlatively controlled to prevent them from being synchronous with each other. With this arrangement, every time the DCS gas is sprayed, the DCS gas is supplied to a different position of the semiconductor wafers W in the annular direction, so that the planar uniformity of the film thickness can be improved. However, where the DCS gas is sprayed three times or more in one adsorption step T1, the DCS gas may be distributed at least two different portions, thereby obtaining a certain effect.

As the rotational period of the wafers (the time necessary for the wafers to make one revolution) is increased (as the wafer rotational speed is decreased), the spray of the DCS gas is more distributed. However, if the wafer rotational speed is too low, the planar uniformity of the film to be formed on the wafers W may be deteriorated due to other factors. On the other hand, if the wafer rotational speed is too high, the film to be formed on the wafers W may be adversely affected by physical factors. Accordingly, the time X necessary for the wafers to make one revolution (one-revolution time) is set in accordance with the following formulas within a basic range of 6 to 120 seconds, and preferably of 12 to 60 seconds.

In the following formulas, X is the wafer one-revolution time, L1 is the length of the supply sub-step T1a, L2 is the length of the intermediate sub-step T1b, and N is the number of times the supply sub-step T1a is performed in one adsorption step T1 (DCS pulse number). This number N is a positive integer practically of 5 or less, and preferably of 3 or less.

Within the basic range described above, the wafer one-revolution time X is expressed by the following formula (1) where the wafer rotational speed is set relatively low, or the following formula (2) where the wafer rotational speed is set relatively high.

$$X=(L1+L2)\times(1+\alpha) \quad (1)$$

where α is set to satisfy 0.2<α, preferably 0.5<α, and more preferably 0.8<α.

$$X=(L1+L2)\div 2\times(1+\beta) \quad (2)$$

where β is set to satisfy 0.15<β<0.8, preferably 0.2<β<0.6, and more preferably 0.25<β0.4.

For the formulas (1) and (2), example computations will be shown below.

(A) For example, as described above, where L1=3 seconds and L2=11 seconds, the wafer one-revolution time X is calculated as follows.

The formula (1) takes on X=(3+11)×(1+α)=14×(1+α) (seconds). Accordingly, X is set at a value that satisfies 16.8<X, preferably 21<X, and more preferably 25.2<X (in units of second).

The formula (2) takes on X=(3+11)÷2×(1+β)=7×(1+β) (seconds). Accordingly, X is set at a value that satisfies 8.05<X<12.6, preferably 8.4<X<11.2, and more preferably 8.75<X<9.8 (in units of seconds).

However, in a more preferably manner, within the basic range described above, the wafer one-revolution time is expressed by the following formula (3).

$$X=(L1+L2)\times N\times(1+\gamma) \quad (3)$$

where γ is set to satisfy −0.3<γ<+0.3, preferably −0.2<γ<+0.2, more preferably −0.1<γ<+0.1, and furthermore preferably −0.05<γ<+0.05.

For the formula (3), example computations will be shown below.

(B) For example, as described above, where L1=3 seconds, L2=11 seconds, and N=2, the wafer one-revolution time X is calculated as follows.

The formula (3) takes on X=(3+11)×2×(1+γ)=28×(1+γ) (seconds). Accordingly, X is set at a value that satisfies 19.6<X<36.4, preferably 22.4<X<33.6, more preferably 25.2<X<30.8, and furthermore preferably 26.6<X<29.4 (in units of seconds).

(C) On the other hand, where L1=2 seconds, L2=8 seconds, and N=3, the wafer one-revolution time X is calculated as follows.

The formula (3) takes on X=(2+8)×3×(1+γ)=30×(1+γ) (seconds). Accordingly, X is set at a value that satisfies 21<X<39, preferably 24<X<36, more preferably 27<X<33, and furthermore preferably 28.5<X<31.5 (in units of seconds).

In this embodiment, the buffer tank 57 is disposed on the gas supply line 50 of the first process gas supply circuit 30 and is temporarily charged with the DCS gas (source gas). However, where the amount of source gas to be used is small, the gas supply line 50 may be formed to have a buffer tank function in place of the buffer tank 57. In this case, the switching valves 50B and 57B may be disposed as they are, or only one of the switching valves may be disposed.

Also in this case, the switching valves 50B and 57B are opened and closed as in the embodiment described above, so that the same effects as those of the embodiment are provided.

EXPERIMENT 1

Figure 4:
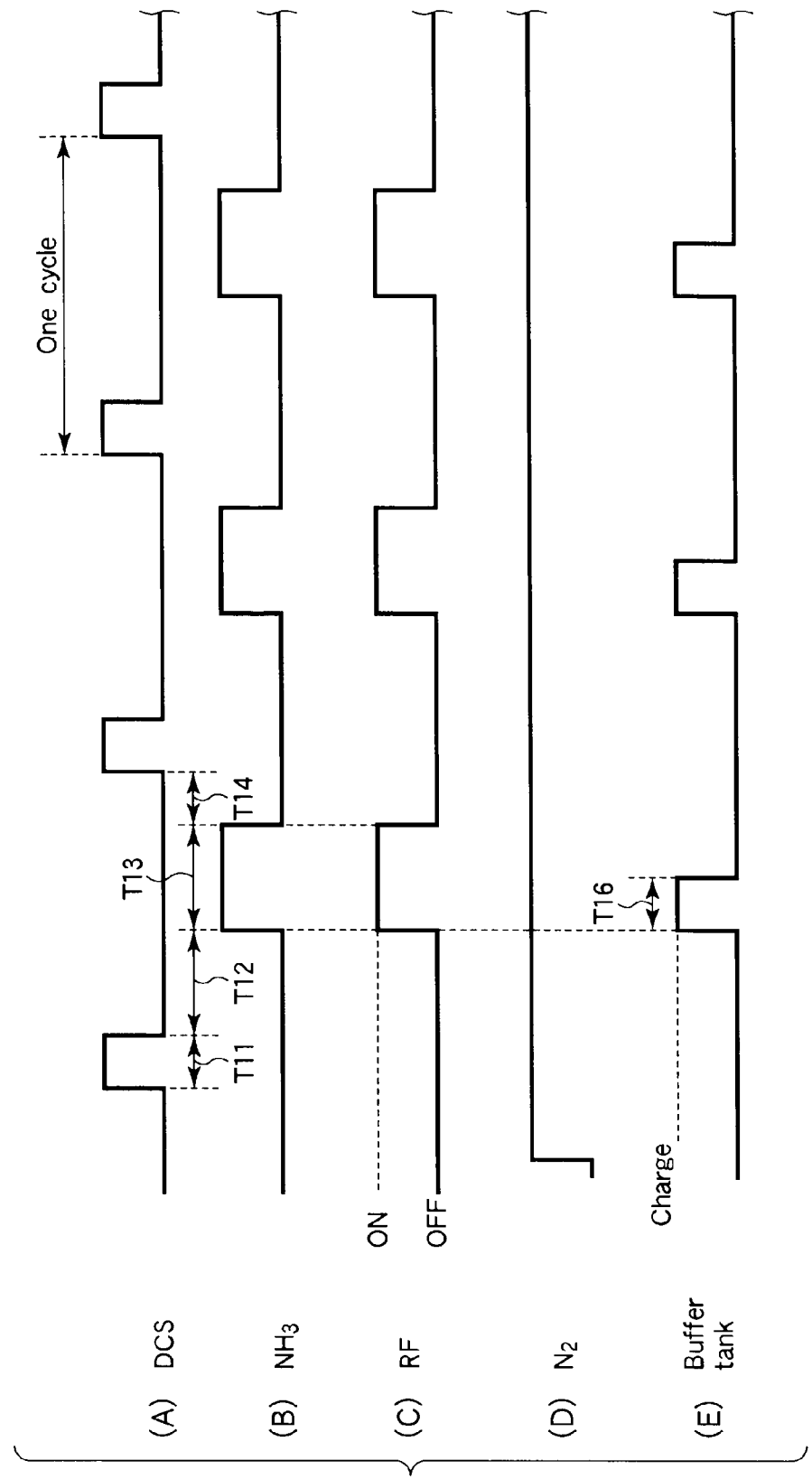
FIG. 4 is a timing chart showing the gas supply, RF (radio frequency) application, and buffer tank charge of a film formation method according to a comparative example.

A silicon nitride film was formed by use of a film formation method according to a present example PE of the embodiment described above and a film formation method according to a comparative example CE, and the film formation rate and the refractive index (depending on the Si concentration) of the silicon nitride film were measured. In the comparative example CE, the apparatus shown in FIG. 1 was used, and the DCS gas was supplied merely once in one adsorption step. FIG. 4 is a timing chart showing the gas supply, RF (radio frequency) application, and buffer tank charge of a film formation method according to the comparative example;

As shown in FIG. 4, the comparative example CE was arranged to have an adsorption step with the DCS gas supplied into the process container only once. Accordingly, in this case, the DCS gas supply and the $NH_3$ gas supply relative to the process container were alternately repeated one by one. The DCS gas supply was performed by discharging downstream the DCS gas charged in the buffer tank.

In the film formation method according to the present example PE, the periods of the steps were set such that T1$a$=3 seconds, T1$b$=11 seconds, T2=11 seconds, T3=20 seconds, T4=3 seconds, and T6 (charge)=8 seconds, as described above. On the other hand, in the film formation method according to the comparative example CE, the periods of the steps were set such that T11 (adsorption)=3 seconds, T12 (purge)=14 seconds, T13 (nitridation)=20 seconds, T14 (purge)=3 seconds, and T16 (charge)=8 seconds. In both the examples, the process pressure and process temperature were set the same with the process pressure set to vary within a range of 0.133 to 1,330 Pa and the process temperature set at 630° C. The wafer boat was loaded with 117 semiconductor wafers W.

Figure 5A:
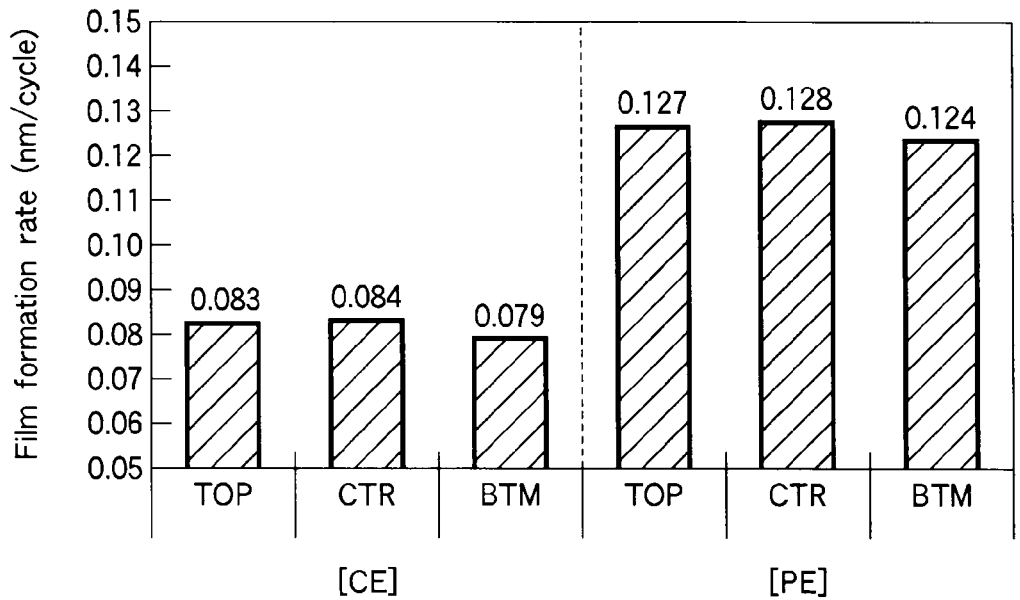
FIG. 5A is a graph showing the film formation rate of a thin film formed by a present example according to the present invention and a comparative example.
Figure 5B:
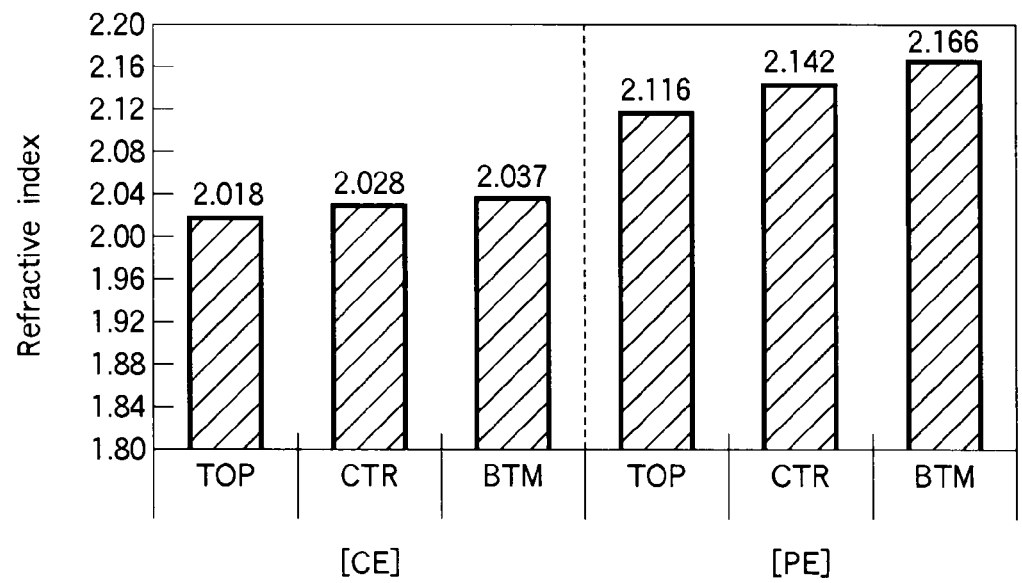
FIG. 5B is a graph showing the refractive index of a thin film formed by a present example according to the present invention and a comparative example.

FIGS. 5A and 5B are graphs showing the film formation rate and refractive index, respectively, of a silicon nitride thin film formed by the present example PE and comparative example CE. In FIG. 5A, the vertical axis denotes the film formation rate (nm/cycle). In FIG. 5B, the vertical axis denotes the refractive index. In FIGS. 5A and 5B, "TOP" denotes a mean value obtained from upper level wafers on the wafer boat, "CTR" denotes a mean value obtained from middle level wafers, and "BTM" denotes a mean value obtained from lower level wafers.

As regards the film formation rate per cycle of the silicon nitride film shown in FIG. 5A, the comparative example CE rendered a film formation rate of about 0.079 to 0.084 nm. On the other hand, the present example PE rendered a film formation rate of about 0.124 to 0.128 nm, which was an improvement of about 30 to 60% in the film formation rate as compared to the comparative example CE.

As regards the refractive index of the silicon nitride film shown in FIG. 5B, the comparative example CE rendered a refractive index of about 2.018 to 2.037. On the other, the present example PE rendered a refractive index of about 2.116 to 2.166, which was larger than that of the comparative example CE. It is known that this refractive index depends on the concentration of Si or the element component in the source gas (DCS gas), such that the refractive index is higher along with an increase in the Si concentration. Thus, according to the present example PE, it is expected that the Si concentration in the film to be formed can be flexibly controlled by adjusting the number of times the DCS gas is supplied in one adsorption step or adjusting the length of one supply sub-step T1$a$ of supplying the DCS gas.

EXPERIMENT 2

Figure 6:
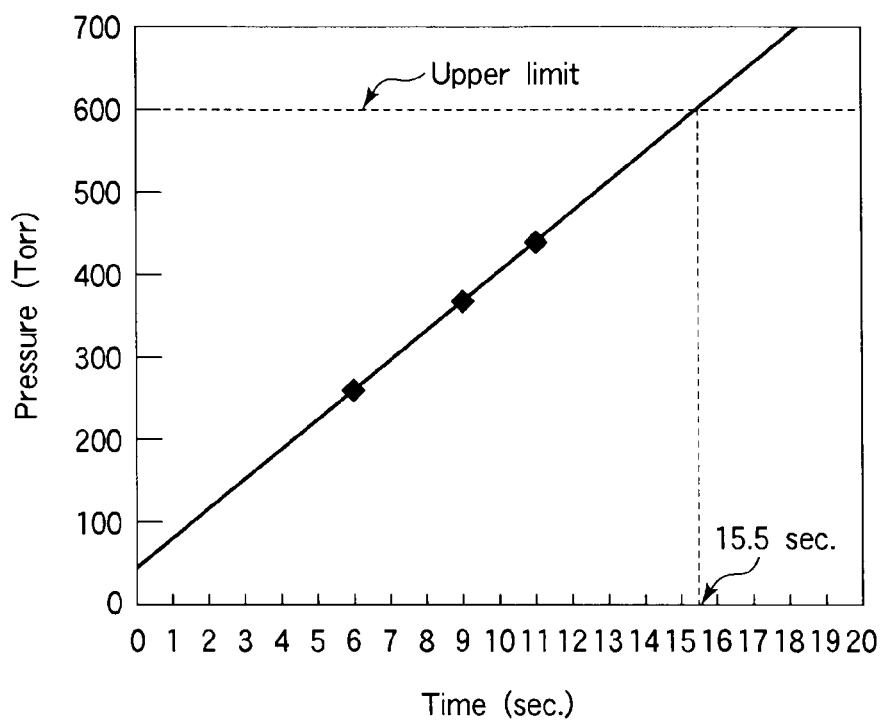
FIG. 6 is a graph showing the relationship of the charge time of DCS gas supplied into the buffer tank with the pressure inside the buffer tank.

Studies were made as to the safety concerning the DCS gas charged into the buffer tank 57 and the safety concerning the DCS gas supplied into the process container. FIG. 6 is a graph showing the relationship of the charge time of DCS gas supplied into the buffer tank with the pressure inside the buffer tank. In FIG. 6, the horizontal axis denotes the charge time (seconds), and the vertical axis denotes the pressure (Torr) inside the buffer tank. For the safety of the buffer tank 57 concerning the DCS gas, the upper limit of the pressure inside the buffer tank 57 is 600 Torr (79.98 kPa).

As shown in FIG. 6, with an increase in the charge time of DCS gas supplied into the buffer tank, the pressure inside the buffer tank was linearly increased, and the pressure reached the upper limit of 600 Torr in a charge time of about 15.5 seconds. In the case of FIG. 3, (E), the charge period T6 is 8 seconds smaller than 15.5 seconds described above, and thus the safety of the buffer tank 57 is sufficiently secured.

Figure 7:
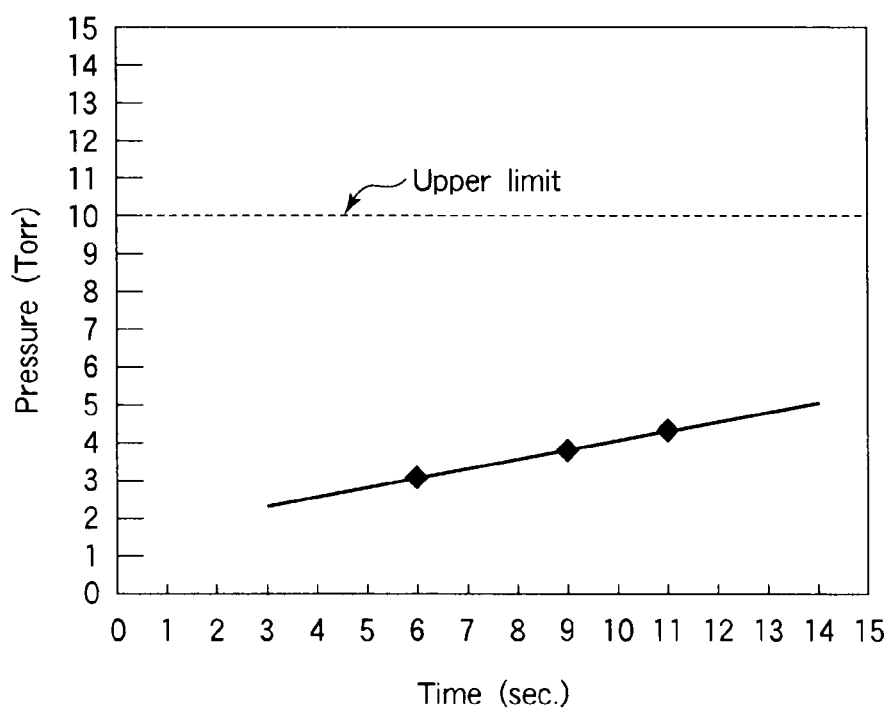
FIG. 7 is a graph showing the relationship of the charge time of DCS gas supplied into the buffer tank with the pressure inside the process container applied by the DCS gas discharged from the buffer tank.

Further, as described above, a study was made on the safety of the process container 4 when the DCS gas charged in the buffer tank was discharged into the process container 4. FIG. 7 is a graph showing the relationship of the charge time of DCS gas supplied into the buffer tank with the pressure inside the process container applied by the DCS gas discharged from the buffer tank. In the FIG. 7, the horizontal axis denotes the charge time (seconds), and the vertical axis denotes the pressure (Torr) inside the process container. For the safety of the process container 4 concerning the DCS gas, the upper limit of the pressure inside the process container 4 is 10 Torr (1,333 Pa).

As shown in FIG. 7, when the charge period relative to the buffer tank 57 reached the upper limit of 15.5 seconds for the safety in the case of FIG. 6, the pressure inside the process container 4 was about 6 Torr (800 Pa) far lower than the upper limit value of 10 Torr. This also endorses that the safety is sufficiently secured.

MODIFICATION

In the embodiment described above, the second process gas containing the reactive gas or $NH_3$ gas is activated by the gas exciting section 66, but this gas exciting section 66 may be not used. Further, this embodiment includes only one buffer tank 57 on the gas supply line 50, but a plurality of, such as two, buffer tanks 57 may be disposed in series (along with the switching valves 50B and 57B) on the gas supply line 50 and alternately used.

In the embodiment described above, a silicon nitride film is formed as a thin film. Alternately, the present invention may be applied to film formation of a silicon nitride film or the like containing an impurity, such as boron, a silicon oxide film, or a silicon oxynitride film.

In the embodiment described above, the first process gas contains DCS gas as a silicon-containing gas. In this respect, the silicon-containing gas may be at least one gas selected from the group consisting of dichlorosilane (DCS), hexachlorodisilane (HCD), monosilane ($SiH_4$), disilane ($Si_2Cl_6$), hexamethyldisilazane (HMDS), tetrachlorosilane (TCS), disilylamine (DSA), trisilylamine (TSA), bistertialbutylaminosilane (BTBAS), bisdimethylaminosilane (BDEAS), diisopropylaminosilane (DIPAS), and trisdimethylaminosilane (3DMAS).

In place of the silicon-containing gas, an organic metal compound gas may be used as a source gas. In this respect, the organic metal compound gas may be at least one gas selected from the group consisting of trimethyl aluminum (TMA), tetrakisdimethylamino hafnium (TDMAH), tetrakisethylmethylamino hafnium (TEMAH), tetrakisethylmethylamino zirconium (TEMAZ), and tetrakisdimethylamino titanium (TDMAT).

In place of the nitride gas ($NH_3$ gas), an oxide gas or reduction gas may be used as a reactive gas, depending on the process content.

As a target substrate, the semiconductor wafer mentioned here encompasses a silicon substrate and a compound semiconductor substrate, such as GaAs, SiC, or GaN. Further, the present invention may be applied to another target substrate, such as a glass substrate for LCD devices or a ceramic substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film formation method, in a vertical batch film formation apparatus, for forming a reaction product film on a plurality of target substrates by a reaction between substances derived from a source gas and a reactive gas within a process field inside a process container configured to accommodate the target substrates at intervals in a vertical direction and to be supplied with the source gas and the reactive gas, the method repeating a cycle a plurality of times while continuously rotating the target substrates at a rotational speed to laminate thin films formed by respective times, the cycle comprising in order:
an adsorption step of performing supply of the source gas to the process field, thereby adsorbing source substances derived form the source gas onto a surface of the target substrates;
a first purge step of exhausting gas from the process field without performing supply of the source gas and the reactive gas to the process field;
a reaction step of performing supply of the reactive gas to the process field, thereby causing reactive substances derived from the reactive gas to react with the source substances adsorbed on the surface of the target substrates; and
a second purge step of exhausting gas from the process field without performing supply of the source gas and the reactive gas to the process field,
wherein the adsorption step makes a plurality of times a supply sub-step of performing supply of the source gas to the process field with an intermediate sub-step of stopping supply of the source gas to the process field interposed therebetween, while maintaining a shut-off state of supply of the reactive gas to the process field, and
wherein the reaction step continuously performs supply of the reactive gas to the process field, while maintaining a shut-off state of supply of the source gas to the process field.

2. The method according to claim 1, wherein the source gas is supplied from a gas distribution nozzle disposed along the process field and having a plurality of gas spouting holes formed therein at intervals in a vertical direction.

3. The method according to claim 2, wherein timing of the supply sub-step in the cycle is set correlatively to the rotational speed to supply the source gas onto different positions on the target substrates in an annular direction while performing the adsorption step once.

4. The method according to claim 3, wherein one revolution time of the target substrates is within a range of 6 seconds to 120 seconds.

5. The method according to claim 3, wherein one revolution time X of the target substrates is expressed by a following formula within a range of 6 seconds to 120 seconds, $$X=(L1+L2)\times N\times(1+\gamma),$$

where L1 is a length of the supply sub-step, L2 is a length of the intermediate sub-step, N is the number of times the supply sub-step is made in the adsorption step (N is a positive integer of 5 or less), and γ satisfies $-0.3<\gamma<+0.3$.

6. The method according to claim 1, wherein the method comprises supplying the source gas into a buffer tank disposed outside the process container to temporarily store the source gas therein, and performing and stopping discharge of the source gas from the buffer tank to the process field in accordance with the supply sub-step and the intermediate sub-step, respectively.

7. The method according to claim 6, wherein the source gas is not supplied into the buffer tank during the supply sub-step, but is supplied into the buffer tank during the intermediate sub-step.

8. The method according to claim 6, wherein the source gas is mixed with an inactive gas at a position downstream from the buffer tank and outside the process container and then supplied to the process field, and the inactive gas is kept supplied during the cycle.

9. The method according to claim 1, wherein the reaction step includes an excitation period of supplying the reactive gas to the process field while exciting the reactive gas by a plasma exciting mechanism.

10. The method according to claim 1, wherein the source gas contains at least one silicon-containing gas selected from the group consisting of dichlorosilane, hexachlorodisilane, monosilane, disilane, hexamethyldisilazane, tetrachlorosilane, disilylamine, trisilylamine, bistertialbutylaminosilane, bisdimethylaminosilane, diisopropylaminosilane, and trisdimethylaminosilane, and the reactive gas contains at least one gas selected from the group consisting of a nitriding gas, an oxidizing gas, and a reduction gas.

11. The method according to claim 1, wherein the source gas contains at least one organic metal compound gas selected from the group consisting of trimethyl aluminum, tetrakis-dimethylamino hafnium, tetrakis-ethylmethylamino hafnium, tetrakisethylmethylamino zirconium, and tetrakis-dimethylamino titanium, and the reactive gas contains at least one gas selected from the group consisting of a nitriding gas, an oxidizing gas, and a reduction gas.

12. The method according to claim 3, wherein the source gas is a silicon-containing gas, the reactive gas is ammonia gas, and the supply sub-step is shorter than the intermediate sub-step.

13. The method according to claim 12, wherein one revolution time X of the target substrates is expressed by a following formula within a range of 6 seconds to 120 seconds, $$X=(L1+L2)\times N\times(1+\gamma),$$

where L1 is a length of the supply sub-step, L2 is a length of the intermediate sub-step, N is the number of times the supply sub-step is made in the adsorption step (N is a positive integer of 5 or less), and $\gamma$ satisfies $-0.3<\gamma<+0.3$.

14. The method according to claim 7, wherein said supplying the source gas into a buffer tank replenishes the source gas by a certain amount, and the supply sub-step supplies to the process field the source gas by the certain amount.

* * * * *